United States Patent
Kubo (10) Patent No.: US 7,741,887 B2
(45) Date of Patent: Jun. 22, 2010

(54) TRIANGULAR WAVE GENERATOR

(75) Inventor: Narihiro Kubo, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 114 days.

(21) Appl. No.: 12/155,363

(22) Filed: Jun. 3, 2008

(65) Prior Publication Data

US 2008/0303563 A1 Dec. 11, 2008

(30) Foreign Application Priority Data

Jun. 6, 2007 (JP) .............................. 2007-150324

(51) Int. Cl.
*H03K 4/06* (2006.01)
(52) U.S. Cl. ........................ 327/131; 327/137; 327/140
(58) Field of Classification Search ......... 327/131–137, 327/140; 323/242, 288, 326
See application file for complete search history.

(56) References Cited

U.S. PATENT DOCUMENTS

| | | | |
|---|---|---|---|
| 4,524,334 A * | 6/1985 | Brajder et al. ............... | 331/135 |
| 5,646,967 A * | 7/1997 | Hee et al. .................... | 375/373 |
| 6,121,802 A * | 9/2000 | Luciano et al. ............. | 327/131 |
| 7,348,812 B2 * | 3/2008 | Ikezawa ..................... | 327/131 |
| 7,403,049 B2 * | 7/2008 | Uchimoto et al. ........... | 327/131 |
| 2007/0052459 A1 | 3/2007 | Ikezawa | |

FOREIGN PATENT DOCUMENTS

JP 2006-50310 2/2006

* cited by examiner

*Primary Examiner*—Hai L Nguyen
(74) *Attorney, Agent, or Firm*—McGinn IP Law Goup, PLLC (57) ABSTRACT

Triangular wave oscillation circuits generate A-wave and B-wave with phases opposite to each other, and are capable of independently controlling oscillation levels of the A-wave and the B-wave. A slope switching circuit including an output voltage monitoring circuit, a slope switching control circuit, and an inverter, monitors output voltages of the triangular wave oscillation circuits, to switch an output voltage generation mode of one triangular wave oscillation circuit whose triangular wave reaches a high level, from an up-slope waveform mode to a down-slope waveform mode, and to switch an output voltage generation mode of the other triangular wave oscillation circuit, from the down-slope waveform mode to the up-slope waveform mode. An oscillation level control circuit controls an oscillation level of the other triangular wave oscillation circuit so that the output voltage of the other of the triangular wave oscillation circuit becomes a reference lower limit crest value during the switching.

11 Claims, 9 Drawing Sheets

PRIOR ART

TRIANGULAR WAVE GENERATOR

BACKGROUND OF THE INVENTION

1. Field of the Invention

The present invention relates to a technology of generating triangular waves, and more particularly, to a technology of generating two phased triangular waves with phases opposite to each other.

2. Description of Related Art

Up to now, a switching regulator is often used for a device incorporating a single high-current power supply, such as a television device or a personal computer. In recent years, along with a demand for a reduction in size, a prolonged battery life, or the like of a mobile device, the switching regulator is generally implemented in the mobile device, and functional blocks such as a CPU, a memory, and a display panel are supplied with power using a single chip.

However, power supply voltages or currents required by the functional blocks are different from each other. Accordingly, in a case of supplying power to those functional blocks by using a single chip, when control thereof is performed with a single triangular wave as a reference, there is a limit to an increase in efficiency and a reduction in size of peripheral parts. If triangular waves with phases opposite to each other are used for the control by the switching regulator with an output of a multi-power supply, a further increase in efficiency and down-sizing of parts can be achieved.

Figure 11:
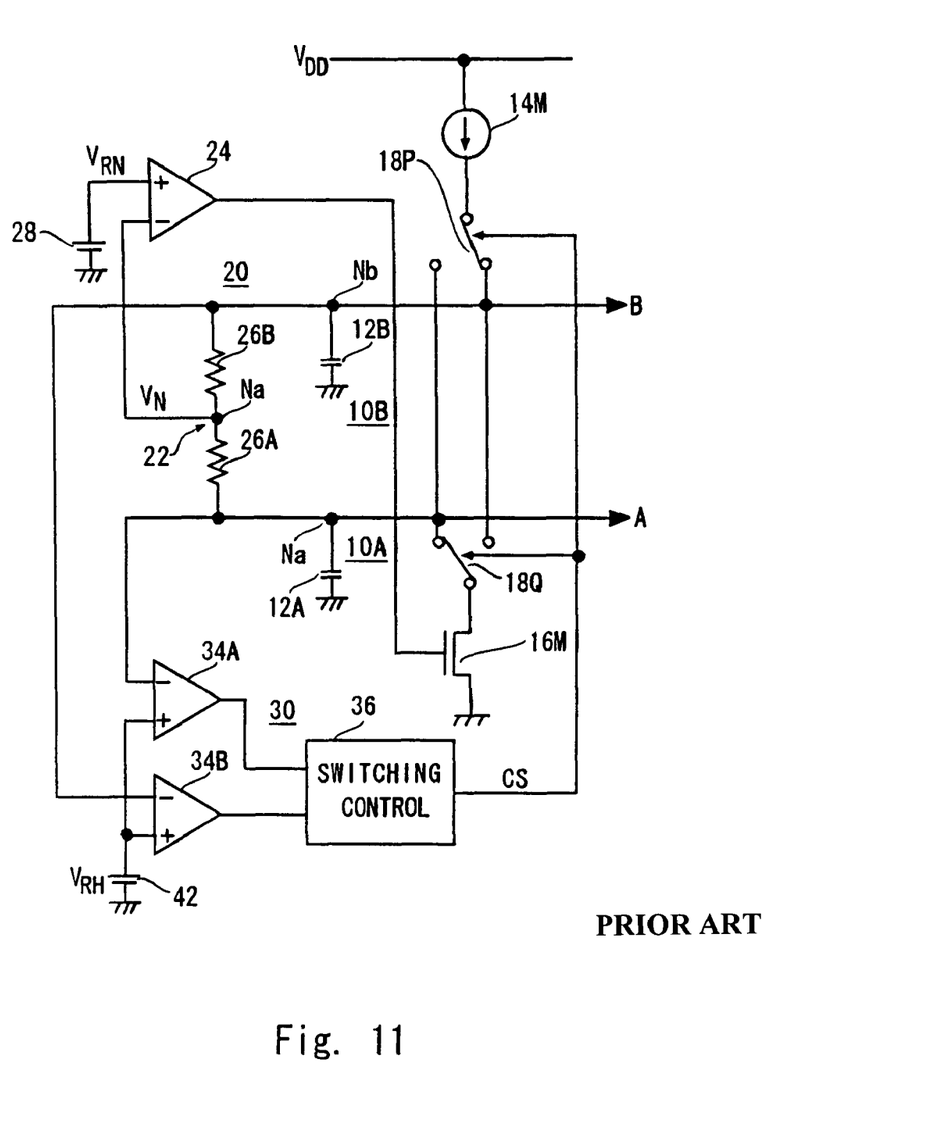
FIG. 11 is a diagram showing a triangular wave generator of a related art.

Japanese Unexamined Patent Application Publication No. 2006-50310 discloses a triangular wave generation circuit for generating two phased triangular waves with phases opposite to each other. FIG. 11 shows the triangular wave generation circuit disclosed in Japanese Unexamined Patent Application Publication No. 2006-50310, and corresponds to FIG. 4 of Japanese Unexamined Patent Application Publication No. 2006-50310.

As shown in FIG. 11, the triangular wave generation circuit includes: a triangular wave generation circuit 10A; a triangular wave generation circuit 10B; a midpoint potential fixing unit 20 for fixing a midpoint potential $V_N$ between output voltages of an A-wave and a B-wave of the triangular wave generation circuits 10A and 10B at a constant value (reference midpoint potential $V_{RN}$); and a mode switching unit 30 for switching an output voltage generation mode (up-slope waveform generation mode or down-slope waveform generation mode) of each of the triangular wave generation circuits 10A and 10B.

In the configuration shown in FIG. 11, the triangular wave generation circuits 10A and 10B share a source constant-current circuit 14M and a sink constant-current circuit 16M in a switching manner. Specifically, the source constant-current circuit 14M is selectively connected to one of a first node $N_A$ and a second node $N_B$ through a changeover switch 18P. The sink constant-current circuit 16M is selectively connected to one of the first node $N_A$ and the second node $N_B$ through a changeover switch 18Q. The changeover switches 18P and 18Q operate in response to a switching control signal CS from a switching control circuit 36 of the mode switching unit 30. The source constant-current circuit 14M is configured as a PMOS transistor having a constant bias. The sink constant-current circuit 16M is configured as an NMOS transistor having a variable bias, and an output of a midpoint potential control circuit 24 provided to the midpoint potential fixing unit 20 is input as a bias to a control terminal of the sink constant-current circuit 16M.

The midpoint potential fixing unit 20 includes a midpoint potential detection circuit 22 and the midpoint potential control circuit 24. The midpoint potential detection circuit 22 includes resistors 26A and 26B having the same resistance value, and detects the midpoint potential $V_N$ between the A-wave and the B-wave. The midpoint potential control circuit 24 controls an output current of the sink constant-current circuit 16M so that the midpoint potential $V_N$ becomes equal to the reference midpoint potential $V_{RN}$ supplied from a reference voltage generation circuit 28.

The mode switching unit 30 includes two comparators 34A and 34B and the switching control circuit 36. The comparators 34A and 34B monitor output voltages of the triangular wave generation circuits 10A and 10B, respectively, and output the monitoring results to the switching control circuit 36. The switching control circuit 36 causes the changeover switches 18P and 18Q to be switched in response to the switching control signal CS when the output voltage of one of the triangular wave generation circuits 10A and 10B reaches a reference upper limit crest value. As a result, the output voltage generation mode of one of the triangular wave generation circuits 10A and 10B, which has an output voltage that reaches the crest value, is switched from an up-slope waveform mode to a down-slope waveform mode. Further, the output voltage generation mode of the other of the triangular wave generation circuits 10A and 10B is switched from the down-slope waveform mode to the up-slope waveform mode.

Figure 12:
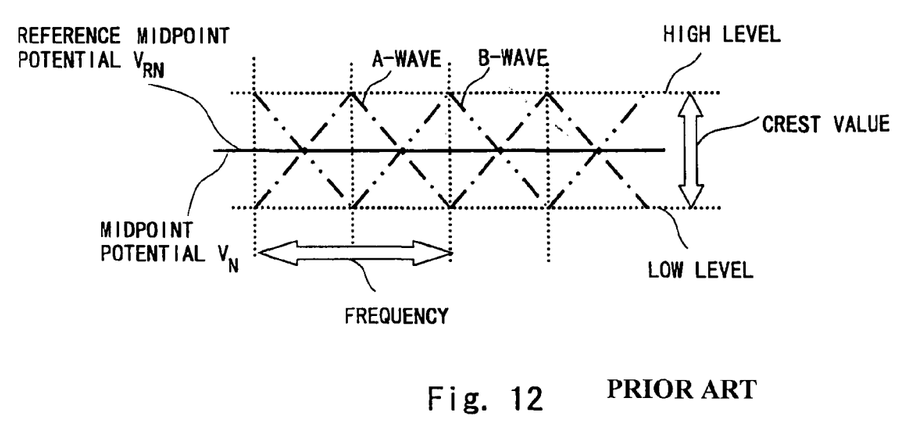
FIG. 12 is a diagram showing two phased triangular waves to be generated by the triangular wave generator shown in FIG. 11.

The triangular wave generation circuits each having the configuration shown in FIG. 11 are provided for outputting triangular waves of the A-wave and the B-wave with phases opposite to each other as shown in FIG. 12. The A-wave and the B-wave have the same frequency and the same crest value. The midpoint potential $V_N$ between the A-wave and the B-wave is fixed at the reference midpoint potential $V_{RN}$. A high level shown in FIG. 12 corresponds to the reference upper limit crest value, and a low level shown in FIG. 12 corresponds to a reference lower limit crest value.

Incidentally, when the capacitors 12A and 12B which are included in the triangular wave generation circuits 10A and 10B, respectively, do not vary in capacitance, oscillation waveforms as shown in FIG. 12 can be obtained with the triangular wave generation circuit having the configuration shown in FIG. 11. On the other hand, the present invention has recognized that when the capacitors 12A and 12B vary in capacitance, there may arise a problem in that it is impossible to maintain the crest values of the A-wave and the B-wave at the same level.

Figure 13:
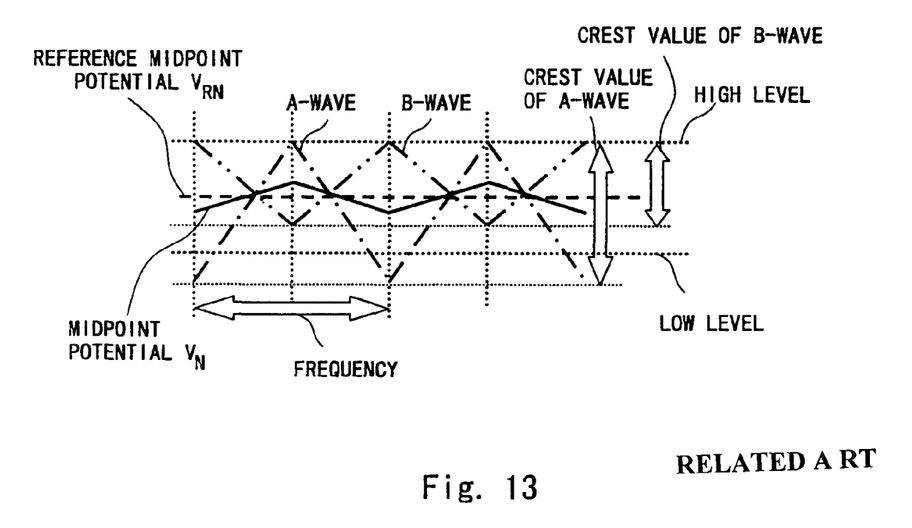
FIG. 13 is a diagram for explaining a problem of the related art.

When the capacitors 12A and 12B, which are included in the triangular wave generation circuits 10A and 10B, respectively, vary in capacitance, in order to maintain the crest values of the A-wave and the B-wave at the same level, it is necessary to supply a discharging current according to the variation of each of the capacitors 12A and 12B. Incidentally, since current sources for discharging the capacitors 12A and 12B each serve as the sink constant-current circuit 16M, there occurs a difference in discharge time constant between the A-wave and the B-wave due to a relative error between the capacitors 12A and 12B. As a result, even by controlling the sink constant-current circuit 16M, it is impossible to control the midpoint $V_N$ between the A-wave and the B-wave to be matched with the reference midpoint potential $V_{RN}$. Therefore, there is a fear that the A-wave and the B-wave that have the same frequency and different crest values, for example, oscillation waveforms as shown in FIG. 13 may be generated.

SUMMARY

In one embodiment of the present invention, there is provided a triangular wave generator. The triangular wave generator includes two triangular wave oscillation circuits generating triangular waves with phases opposite to each other, a slope switching circuit, and an oscillation level control circuit. The two triangular wave oscillation circuits are capable of independently controlling oscillation levels of the triangular waves generated by the two triangular wave oscillation circuits. The slope switching circuit monitors an output voltage of each of the two triangular wave oscillation circuits. Further, the slope switching circuit switches an output voltage generation mode of one of the two triangular wave oscillation circuits, from an up-slope waveform mode to a down-slope waveform mode, when an output voltage of the one of the two triangular wave oscillation circuits reaches a reference upper limit crest value, and switches an output voltage generation mode of the other of the two triangular wave oscillation circuits, from the down-slope waveform mode to the up-slope waveform mode. During switching of the output voltage generation mode, the oscillation level control circuit controls the oscillation level of each of the two triangular wave oscillation circuits so that the output voltage of the other of the two triangular wave oscillation circuits, that is, the triangular wave oscillation circuit whose output voltage generation mode is switched from the up-slope waveform mode to the down-slope waveform mode becomes a reference lower limit crest value.

The above embodiment replaced with a system or a program is also effective as the embodiment of the present invention.

With the technology of the present invention, in a case of generating two phased triangular waves with phases opposite to each other, it is possible to maintain a constant frequency and a constant crest value of each of the two triangular waves.

BRIEF DESCRIPTION OF THE DRAWINGS

The above and other objects, advantages and features of the present invention will be more apparent from following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings.

First Embodiment

Figure 1:
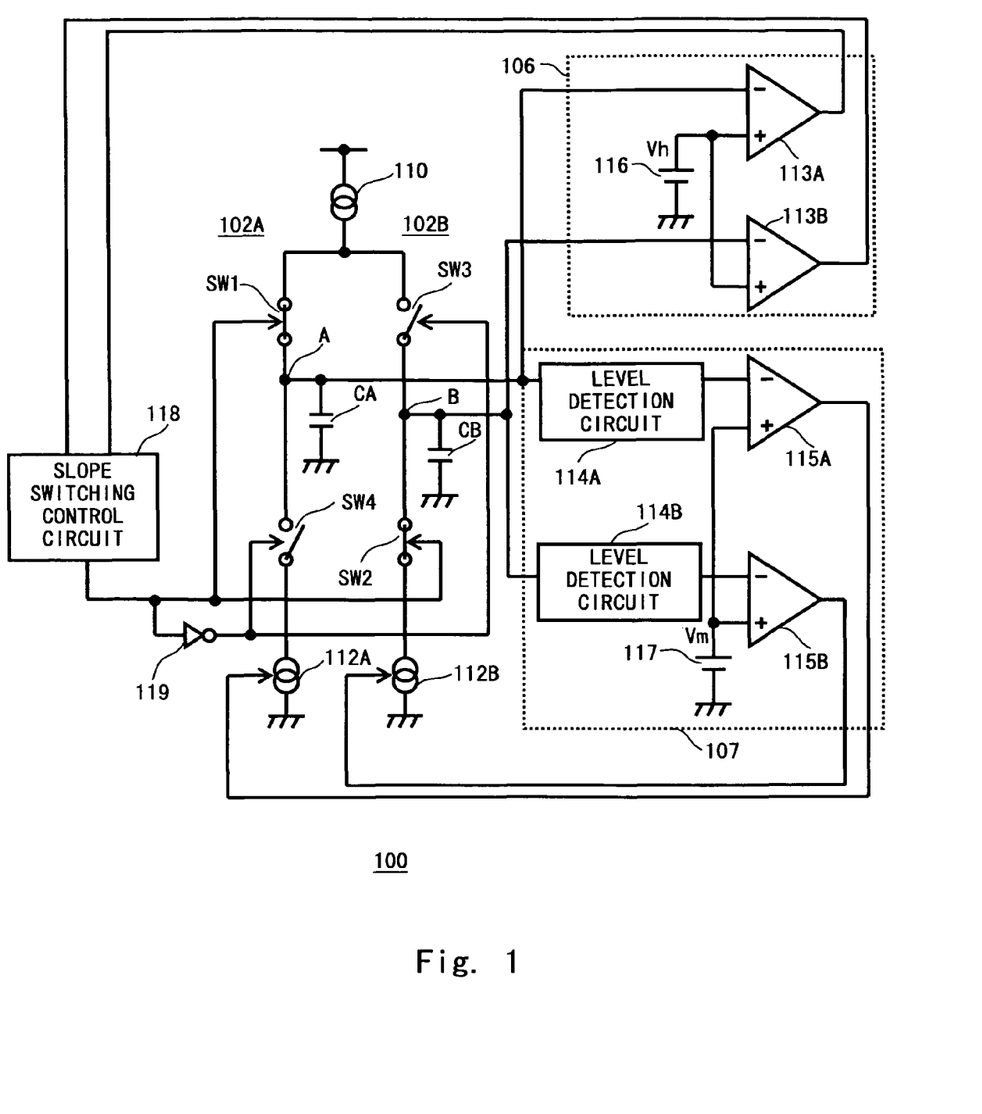
FIG. 1 is a diagram showing a triangular wave generator according to a first embodiment of the present invention.

FIG. 1 shows a triangular wave generator 100 according to a first embodiment of the present invention. The triangular wave generator 100 includes: a first triangular wave oscillation circuit 102A; a second triangular wave oscillation circuit 102B; an output voltage monitoring circuit 106 for monitoring an output voltage of each of the triangular wave oscillation circuits 102A and 102B to detect whether each output voltage reaches a reference upper limit crest value (which corresponds to high level represented by Vh of FIG. 1); a slope switching control circuit 118 for controlling switching of an output voltage generation mode of each of the first triangular wave oscillation circuit 102A and the second triangular wave oscillation circuit 102B according to an output of the output voltage monitoring circuit 106; an inverter 119 for inverting signals from the slope switching control circuit 118; and an oscillation level control circuit 107 for controlling an oscillation level of each of the triangular wave oscillation circuits 102A and 102B.

The first triangular wave oscillation circuit 102A includes: a capacitor CA connected between an output terminal "A" of the first triangular wave oscillation circuit 102A and a reference potential (GND in this case); a charging constant current source 110; a discharging current source 112A; a switch SW1 which is turned on to connect the charging constant current source 110 to the capacitor CA, to thereby allow the capacitor CA to be charged; and a switch SW4 which is turned on/off at a phase opposite to that of the switch SW1 and which is turned on to connect the discharging current source 112A to the capacitor CA, to thereby allow the capacitor CA to be discharged. Hereinafter, a triangular wave which is generated by the first triangular wave oscillation circuit 102A and output from the output terminal "A" is referred to as an "A-wave".

The second triangular wave oscillation circuit 102B includes: a capacitor CB connected between an output terminal "B" of the second triangular wave oscillation circuit 102B and the GND; the charging constant current source 110; a discharging current source 112B; a switch SW3 which is turned on/off at a phase opposite to that of the switch SW1 of the first triangular wave oscillation circuit 102A and which is turned on to connect the charging constant current source 110 to the capacitor CB, to thereby allow the capacitor CB to be charged; and a switch SW2 which is turned on/off at a phase opposite to that of the switch SW3 and which is turned on to connect the discharging current source 112B to the capacitor CB, to thereby allow the capacitor CB to be discharged. Hereinafter, a triangular wave which is generated by the second triangular wave oscillation circuit 102B and output from the output terminal "B" is referred to as a "B-wave".

Turning on/off of each of the switches SW1 to SW4 is controlled by the slope switching control circuit 118. The switches SW1 and SW2 are turned on/off at the same phase, and the switches SW3 and SW4 are turned on/off at a phase opposite to that of each of the switches SW1 and SW2.

Figure 2:
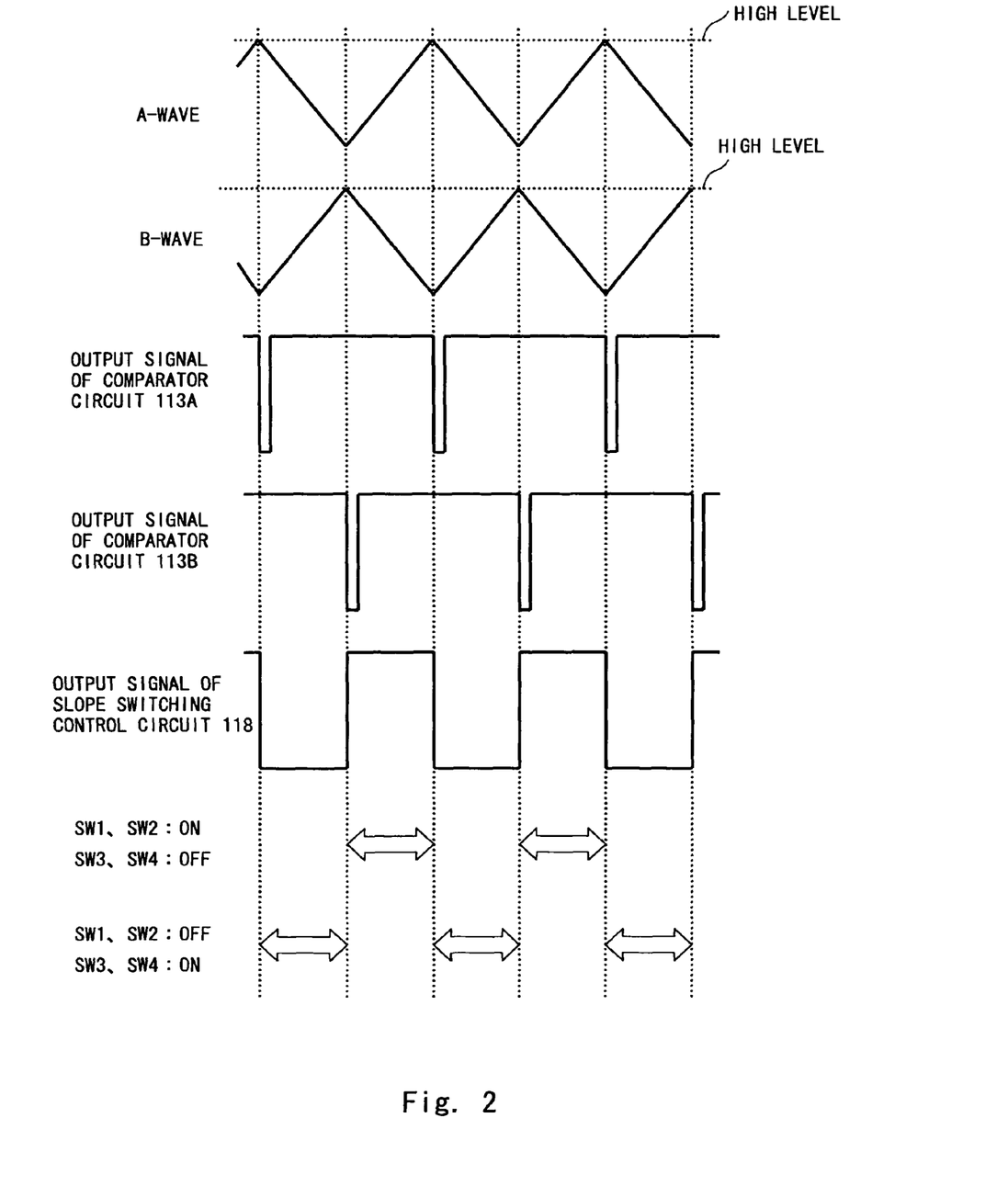
FIG. 2 is a diagram showing a timing relation between signals of the triangular wave generator shown in FIG. 1.

FIG. 2 shows states of signals generated by the triangular wave generator 100, generation timings of the signals, states of the switches, and an on/off timing relation of the switches. As shown in FIG. 2, when the switches SW1 and SW2 are turned off, the capacitor CA is discharged, whereby the A-wave has a down-slope waveform. In this case, since the switches SW3 and SW4 are turned on, the capacitor CB is charged, whereby the B-wave has an up-slope waveform.

On the other hand, when the switches SW1 and SW2 are turned on, the capacitor CA is charged, whereby the A-wave has the up-slope waveform. In this case, since the switches SW3 and SW4 are turned off, the capacitor CB is discharged, whereby the B-wave has the down-slope waveform.

In this manner, the first triangular wave oscillation circuit 102A and the second triangular wave oscillation circuit 102B generate triangular waves of the A-wave and the B-wave with phases opposite to each other.

The charging constant current source 110 is, for example, a PMOS transistor having a constant bias. Each of the discharging current sources 112A and 112B is a variable current source, which is, for example, an NMOS transistor having a variable bias. A current supplied from each of the discharging current sources 112A and 112B is controlled by the oscillation level control circuit 107 to be described in detail later.

The output voltage monitoring circuit 106, the slope switching control circuit 118, and the inverter 119 form a slope switching circuit for switching the waveform of each of the A-wave and the B-wave.

The output voltage monitoring circuit 106 includes: a reference voltage source 116 for supplying a reference upper limit crest value set with respect to each of the A-wave and the B-wave, that is, the high level Vh; and comparator circuits 113A and 113B for comparing voltages of the A-wave and the B-wave, respectively, with the high level Vh supplied by the reference voltage source 116.

When the voltage of the A-wave reaches the high level Vh, the comparator circuit 113A outputs a signal indicating that the A-wave reaches the high level Vh, to the slope switching control circuit 118. Specifically, after comparing the voltage of the A-wave with the high level Vh, the comparator circuit 113A outputs a signal indicating a normal state, for example, a high level signal, when the voltage of the A-wave is lower than the high level Vh, and outputs an inverted signal of the signal indicating the normal state, that is, a low level signal in this case, when the voltage of the A-wave reaches the high level Vh.

When the voltage of the B-wave reaches the high level Vh, the comparator circuit 113B outputs a signal indicating that the B-wave reaches the high level Vh, to the slope switching control circuit 118. Specifically, in the same manner as in the comparator circuit 113A, after comparing the voltage of the B-wave with the high level Vh, the comparator circuit 113B outputs the high level signal, when the voltage of the B-wave is lower than the high level Vh, and outputs the low level signal obtained by inverting the high level signal, when the voltage of the B-wave reaches the high level Vh.

As shown in FIG. 2, when one of the voltages of the A-wave and the B-wave reaches the high level Vh, the signal indicating that one of the voltages of the A-wave and the B-wave reaches the high level Vh, is output by the corresponding comparator circuit.

Upon reception of the signal, the slope switching control circuit 118 controls the triangular wave oscillation circuit having an output voltage which reaches the high level Vh, that is, the triangular wave oscillation circuit whose output voltage generation mode is an up-slope waveform mode so that the output voltage generation mode is switched to a down-slope waveform mode. At the same time, the slope switching control circuit 118 controls the other triangular wave oscillation circuit, that is, the triangular wave oscillation circuit whose output voltage generation mode is the down-slope waveform mode so that the output voltage generation mode is switched to the up-slope waveform mode.

The above-mentioned control corresponds to an on/off control of each of the switches SW1 to SW4. For example, as shown in FIG. 2, upon reception of the signal indicating that the A-wave reaches the high level Vh, the slope switching control circuit 118 outputs a signal for turning off a switch, to each of the switches SW1 and SW2. Note that the signal is inverted by the inverter 119 to be used as a signal for turning on a switch, and is output to each of the switches SW3 and SW4. Such a state is maintained until the B-wave reaches the high level Vh and the signal indicating that the B-wave reaches the high level Vh is input from the comparator circuit 113B to the slope switching control circuit 118.

Upon reception of the signal indicating that the B-wave reaches the high level Vh, the slope switching control circuit 118 outputs the signal for turning on a switch to each of the switches SW1 and SW2. Note that the signal is inverted by the inverter 119 to be used as the signal for turning off a switch, and is output to each of the switches SW3 and SW4. Then, such a state is maintained until the A-wave reaches the high level Vh and the signal indicating that the A-wave reaches the high level Vh is input from the comparator circuit 113A to the slope switching control circuit 118.

In this manner, the first triangular wave oscillation circuit 102A and the second triangular wave oscillation circuit 102B generate the triangular waves with phases opposite to each other. When the voltage of one of the triangular waves reaches the high level Vh, the output voltage generation modes of both the triangular wave oscillation circuits 102A and 102B are switched. The output voltage generation modes of both the triangular wave oscillation circuits 102A and 102B are switched simultaneously. Accordingly, the A-wave and the B-wave have the same frequency.

Next, a description is given of the oscillation level control circuit 107. When the voltage of one of the A-wave and the B-wave reaches the high level Vh and when the output voltage generation modes of both the triangular wave oscillation circuits 102A and 102B are switched, the oscillation level control circuit 107 controls the oscillation level of the triangular wave oscillation circuit for generating another triangular wave, which is different from the triangular wave having the voltage that reaches the high level Vh, so that the another triangular wave becomes a reference lower limit crest value (hereinafter, referred to as "low level"). In the following description, the voltage of the triangular wave to be switched from the down-slope waveform to the up-slope waveform during the switching of the output voltage generation mode is referred to as a "lower limit crest value" of the triangular wave.

Prior to detailed description of the oscillation level control circuit 107, the relation between the oscillation level and the lower limit crest value is described. In addition, the oscillation level is defined as a mean value between an upper limit crest value and a lower limit crest value of a triangular wave.

Figure 3:
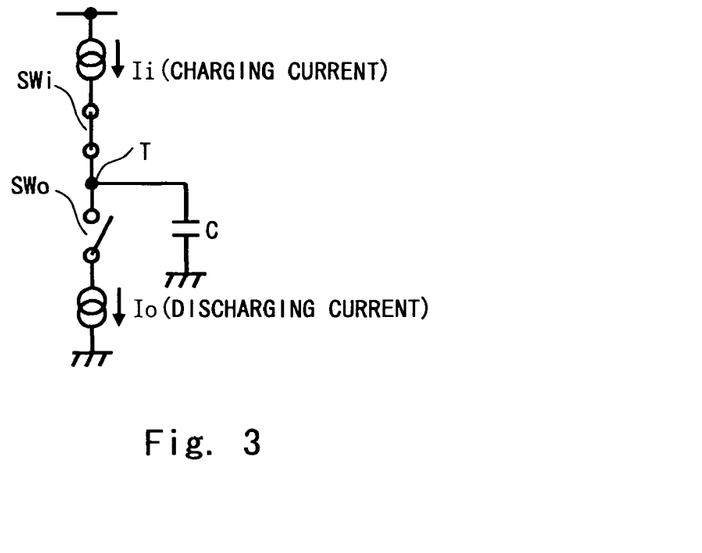
FIG. 3 is a schematic diagram showing a triangular wave oscillation circuit of the triangular wave generator shown in FIG. 1.

FIG. 3 is a schematic diagram showing a triangular wave oscillation circuit for generating triangular waves on the same principle as the first triangular wave oscillation circuit 102A and the second triangular wave oscillation circuit 102B. The triangular wave oscillation circuit generates triangular waves by alternately repeating charging and discharging of a capacitor C connected between an output terminal T of the triangular wave oscillation circuit and the GND. Switching between the charging and discharging of the capacitor C is performed by a switch SWi and a switch SWo that are turned on/off at phases opposite to each other. Specifically, when the switch SWi is turned on, a charging current Ii is supplied to the capacitor C, whereby the capacitor C is charged. When the switch SWo, which is turned on/off at a phase opposite to that of the switch SWi, is turned on, a discharging current Io is supplied to the capacitor C, whereby the capacitor C is discharged. In this case, it is assumed that the switch SWo is controlled to be turned on (switch SWi is turned off simultaneously) when the voltage of the triangular wave reaches a high level VTH and the switch SWi is controlled to be turned on (switch SWo is turned off simultaneously) when the voltage of the triangular wave reaches a low level VTL so that the upper limit crest value and the lower limit crest value of the triangular wave obtained by the triangular wave oscillation circuit shown in FIG. 3 become a reference upper limit crest value (high level VTH) and a reference lower limit crest value (low level VTL), respectively.

Figure 4:
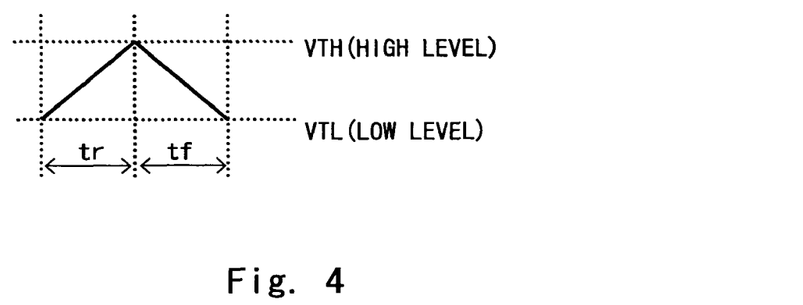
FIG. 4 is a diagram showing a triangular wave generated by a first triangular wave oscillation circuit shown in FIG. 3.

Through such a control, a triangular wave shown in FIG. 4 is generated by the triangular wave oscillation circuit shown in FIG. 3. The crest value of the triangular wave corresponds to a difference between the high level VTH and the low level VTL, and a frequency of the triangular wave corresponds to the sum of a rise time tr and a fall time tf.

The rise time tr and the fall time tf are determined by a capacitance value of the capacitor C, the charging current Ii, and the discharging current Io as represented by the following formulae (1) and (2). Note that the capacitance value of the capacitor C is represented as C.

$$tr = C \times (VTH - VTL)/Ii \quad (1)$$

$$tf = C \times (VTH - VTL)/Io \quad (2)$$

When the above formulae (1) and (2) are applied to each of the first triangular wave oscillation circuit 102A and the second triangular wave oscillation circuit 102B of the triangular wave generator 100 shown in FIG. 1, it is possible to obtain the following formulae (3) and (4):

$$tra = CA \times (VTHa - VTLa)/Iia \quad (3)$$

$$tfa = CA \times (VTHa - VTLa)/Ioa$$

where CA represents the capacitance value of the capacitor CA, tra represents the rise time of the A-wave, tfa represents the fall time of the A-wave, VTHa represents the high level of the A-wave, VTLa represents the low level of the A-wave, Iia represents the charging current of the first triangular wave oscillation circuit 102A, and Ioa represents the discharging current of the first triangular wave oscillation circuit 102A; and $$trb = CB \times (VTHb - VTLb)/Iib \quad (4)$$

$$tfb = CB \times (VTHb - VTLb)/Iob$$

where CB represents the capacitance value of the capacitor CB, trb represents the rise time of the B-wave, tfb represents the fall time of the B-wave, VTHb represents the high level of the B-wave, VTLb represents the low level of the B-wave, Iib represents the charging current of the second triangular wave oscillation circuit 102B, and Iob represents the discharging current of the second triangular wave oscillation circuit 102B.

In the triangular wave generator 100, the charging currents of the first triangular wave oscillation circuit 102A and the second triangular wave oscillation circuit 102B are supplied by the same charging constant current source 110, so the charging currents are set at the same level. The charging currents are each represented simply as "I". Further, the high level of each of the A-wave and the B-wave is set to Vh. Accordingly, the formulae (3) and (4) can be rewritten as the following formulae (5) and (6):

$$tra = CA \times (Vh - VTLa)/I \quad (5)$$

$$tfa = CA \times (Vh - VTLa)/Ioa$$

where CA represents the capacitance value of the capacitor CA, tra represents the rise time of the A-wave, tfa represents the fall time of the A-wave, Vh represents the high level, VTLa represents the low level of the A-wave, I represents the charging current, and the Ioa represents the discharging current of the first triangular wave oscillation circuit 102A; and $$trb = CB \times (Vh - VTLb)/I \quad (6)$$

$$tfb = CB \times (Vh - VTLb)/Iob$$

where CB represents the capacitance value of the capacitor CB, trb represents the rise time of the B-wave, tfb represents the fall time of the B-wave, Vh represents the high level, VTLb represents the low level of the B-wave, I represents the charging current, and the Iob represents the discharging current of the second triangular wave oscillation circuit 102B.

Figure 5:
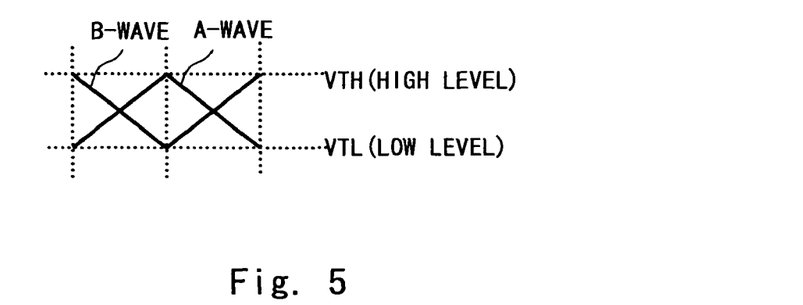
FIG. 5 is a diagram showing two phased triangular waves having the same frequency and the same crest value, with phases opposite to each other.

In this case, a description is given of conditions for obtaining the A-wave and the B-wave having the same frequency and the same crest value, with phases opposite to each other, as shown in FIG. 5. As described above, since the high levels of the A-wave and the B-wave are each set to the same level of Vh. Accordingly, to obtain the same crest value, it is necessary that the low levels represented as VTLa and VTLb be set at the same level. Further, to satisfy conditions for obtaining the same frequency and the opposite phases, it is necessary that the rise time tra of the A-wave and the fall time tfb of the B-wave be set to be equal to each other, and that the fall time tfa of the A-wave and the rise time trb of the B-wave be set to be equal to each other. When the conditions are put into the formulae (5) and (6), the following formulae (7) and (8) can be obtained.

$$CA \times (Vh - VTL)/I = CB \times (Vh - VTL)/Iob \quad (7)$$

$$CA \times (Vh - VTL)/Ioa = CB \times (Vh - VTL)/I \quad (8)$$

Further, the following formula (9) is obtained from the formulae (7) and (8).

$$CA^2 : CB^2 = Ioa : Iob \quad (9)$$

Specifically, a ratio between a current supplied from the discharging current source 112A of the first triangular wave oscillation circuit 102A and a current supplied from the discharging current source 112B of the second triangular wave oscillation circuit 102B, and a ratio between the square of the capacitance value of the capacitor CA and the square of the capacitance value of the capacitor CB satisfy the relation expressed by the formula (9), the A-wave and the B-wave become two phased triangular waves having the same frequency and the same crest value, with phases opposite to each other.

For example, when a capacitance of the capacitor CA is equal to a capacitance of the capacitor CB, by setting the currents supplied by the discharging current sources 112A and 112B to the same value, the A-wave and the B-wave become two phased triangular waves having the same frequency and the same crest value, with phases opposite to each other. When the capacitance value of the capacitor CA is twice as large as the capacitance value of the capacitor CB, by setting the current supplied by the discharging current source 112B to one-fourth of the current supplied by the discharging current source 112A, the A-wave and the B-wave become two phased triangular waves having the same frequency and the same crest value, with phases opposite to each other.

In other words, even when the capacitor CA and the capacitor CB vary in capacitance, by adjusting the currents supplied by the discharging current sources 112A and 112B, the variation in capacitance of the capacitors CA and CB can be absorbed, with the result that two phased triangular waves having the same frequency and the same crest value with phases opposite to each other can be obtained.

In the triangular wave generator 100 of the first embodiment, the discharging current sources 112A and 112B each having a various bias are separately provided to the capacitors CA and CB, respectively. The control of the currents supplied by the discharging current sources 112A and 112B is performed by the oscillation level control circuit 107. Based on the above-mentioned principle, the oscillation level control circuit 107 adjusts bias voltages to be input to the discharging current sources 112A and 112B so that the crest values of the A-wave and the B-wave become equal to each other, thereby controlling both the discharging current sources.

Returning to FIG. 1, the oscillation level control circuit 107 includes: a reference voltage source 117 for supplying an oscillation level reference potential Vm commonly set with respect to the A-wave and the B-wave; a level detection circuit 114A for detecting the oscillation level of the first triangular wave oscillation circuit 102A; a current control circuit 115A for comparing the oscillation level of the A-wave, which is detected by the level detection circuit 114A, with the oscillation level reference potential Vm to control the discharging current source 112A according to the comparison results; a level detection circuit 114B for detecting the oscillation level of the second triangular wave oscillation circuit 102B; and a current control circuit 115B for comparing the oscillation level of the B-wave, which is detected by the level detection circuit 114B, with the oscillation level reference potential Vm to control the discharging current source 112B according to the comparison results.

Specifically, the oscillation level reference potential Vm is set to a value between the reference upper limit crest value, which is commonly set with respect to the A-wave and the B-wave, and the GND. Note that, in the first embodiment, when the voltage of one of the triangular waves reaches the reference upper limit crest value (high level Vh), the output voltage generation modes of the first triangular wave oscillation circuit 102A and the second triangular wave oscillation circuit 102B are switched. Accordingly, the upper limit crest values of the A-wave and the B-wave can be maintained at the high level Vh. To maintain the crest values of the A-wave and the B-wave at the same set value (which corresponds to a difference between a reference upper limit crest value and a reference lower limit crest value), it is necessary that the lower limit crest values of the A-wave and the B-wave be maintained at the reference lower limit crest value. In this case, a relation between the lower limit crest value and the oscillation level is described by taking the B-wave as an example. As described above, the oscillation level is defined as a mean value between an upper limit crest value and a lower limit crest value of a triangular wave.

Figure 6:
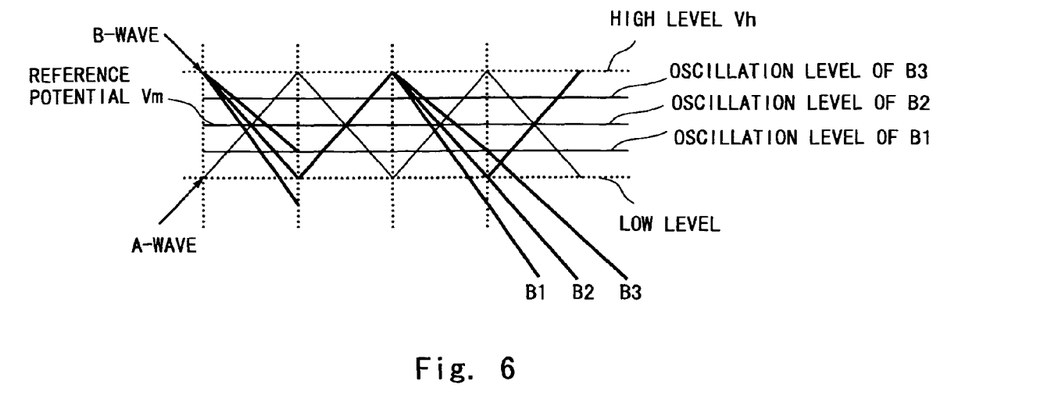
FIG. 6 is a diagram for explaining a relation between an oscillation level and a lower limit crest value.

FIG. 6 shows three B waves (B1, B2, and B3 of FIG. 6) having different oscillation levels. The high level shown in FIG. 6 indicates the reference upper limit crest value, that is, Vh, and the low level shown in FIG. 6 indicates the reference lower limit crest value. As described above, the oscillation level reference potential Vm corresponds to a value set between the high level Vh and the GND. In this case, the oscillation level reference potential Vm is set to an intermediate value between the high level Vh and the low level, for example. As shown in FIG. 6, in the case of B1 with the oscillation level being lower than the reference potential Vm, when the A-wave reaches the high level Vh, the waveform of the A-wave is switched from the up-slope to the down-slope, while the waveform of the wave B1 is switched from the down-slope to the up-slope. In this case, the B1 is lower than the low level. That is, the lower crest value of the B1 is lower than the low level.

On the other hand, in the case of B3 with the oscillation level being higher than the oscillation level reference potential Vm, when the A-wave reaches the high level Vh, the B3 is higher than the low level. That is, the lower limit crest value of the B3 is higher than the low level.

Further, in the case of B2 with the oscillation level being the same as the oscillation level reference potential Vm, when the A-wave reaches the high level Vh, the B2 is set at the same level as the low level. That is, the lower limit crest value of the B2 is the same as the low level.

In view of the above, by adjusting the oscillation level of the B-wave to be set to the oscillation level reference potential Vm, the lower limit crest value of the B-wave becomes the low level.

The crest value of the B-wave corresponds to the difference between the upper crest value and the lower crest value. Accordingly, if the lower limit crest value of the B-wave can be maintained at the low level, the crest value of the B-wave can be maintained at the reference crest value.

The above description can also be applied to the A-wave.

The oscillation level control circuit 107 detects the oscillation level of the B-wave by using the level detection circuit 114B. Then, when the A-wave reaches the high level Vh and when the output voltage generation mode of the second triangular wave oscillation circuit 102B for generating the B-wave is switched from the down-slope waveform mode to the up-slope waveform mode, the current control circuit 115B adjusts the current supplied by the discharging current source 112B of the second triangular wave oscillation circuit 102B so that the voltage of the B-wave becomes the low level, thereby controlling the oscillation level of the B-wave. In other words, the current control circuit 115B controls the discharging current source 112B so that an output of the level detection circuit 114B, that is, a mean value of the B-wave matches the oscillation level reference potential Vm. As a result, the crest value of the B-wave is maintained at the reference crest value.

In a similar manner, the oscillation level control circuit 107 detects the oscillation level of the A-wave by using the level detection circuit 114A. Then, when the B-wave reaches the high level Vh and when the output voltage generation mode of the first triangular wave oscillation circuit 102A for generating the A-wave is switched from the down-slope waveform mode to the up-slope waveform mode, the current control circuit 115A adjusts the current supplied by the discharging current source 112A of the first triangular wave oscillation circuit 102A so that the voltage of the A-wave becomes the low level, thereby controlling the oscillation level of the A-wave. In other words, the current control circuit 115A controls the discharging current source 112A so that an output of the level detection circuit 114A, that is, a mean value of the A-wave matches the oscillation level reference potential Vm. As a result, the crest value of the A-wave is maintained at the reference crest value.

In this manner, by separately controlling the oscillation levels of the first triangular wave oscillation circuit 102A and the second triangular wave oscillation circuit 102B, the crest values of the A-wave and the B-wave can be maintained at the same value.

Figure 7:
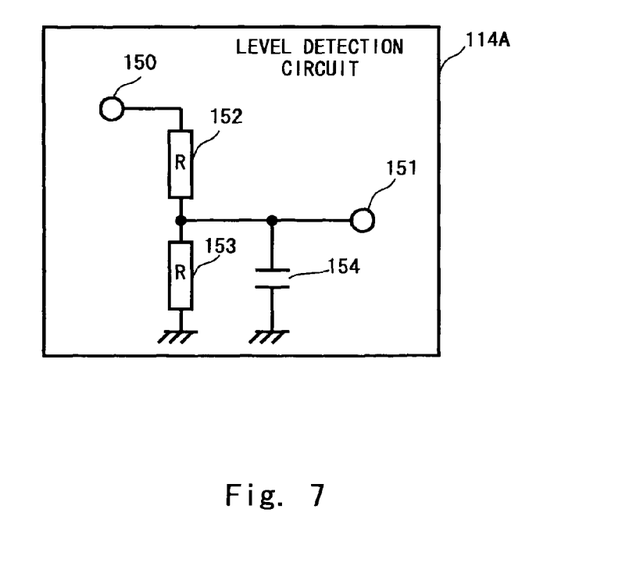
FIG. 7 is a diagram showing a level detection circuit of the triangular wave generator shown in FIG. 1.

The level detection circuit 114A and the level detection circuit 114B, which detect the oscillation levels of the A-wave and the B-wave, respectively, each have the configuration as shown in FIG. 7, for example. Note that, in FIG. 7, only the level detection circuit 114A is illustrated. However, the same configuration can be applied to the level detection circuits 114A and 114B, so illustration and detailed description of the level detection circuit 114B are herein omitted.

As shown in FIG. 7, the level detection circuit 114A includes: an input terminal 150 to which the A-wave is input; resistors 152 and 153 that are connected in series between the input terminal 150 and the reference voltage GND; an output terminal 151 connected to a point (voltage dividing point) between the two resistors; and a capacitor 154 having one end connected between the voltage dividing point and the output terminal 151 and having the other end connected to the GND.

By the level detection circuit 114A shown in FIG. 7, the A-wave is input through the input terminal 150, and the oscillation level of the A-wave is output from the output terminal 151. The current control circuit 115A compares the output with the oscillation level reference potential Vm to control the discharging current source 112A according to the comparison results.

In a similar manner, to the level detection circuit 114B, the B-wave is input and the oscillation level of the B-wave is output. The current control circuit 115B compares the output with the oscillation level reference potential Vm to control the discharging current source 112B according to the comparison results.

Figure 8:
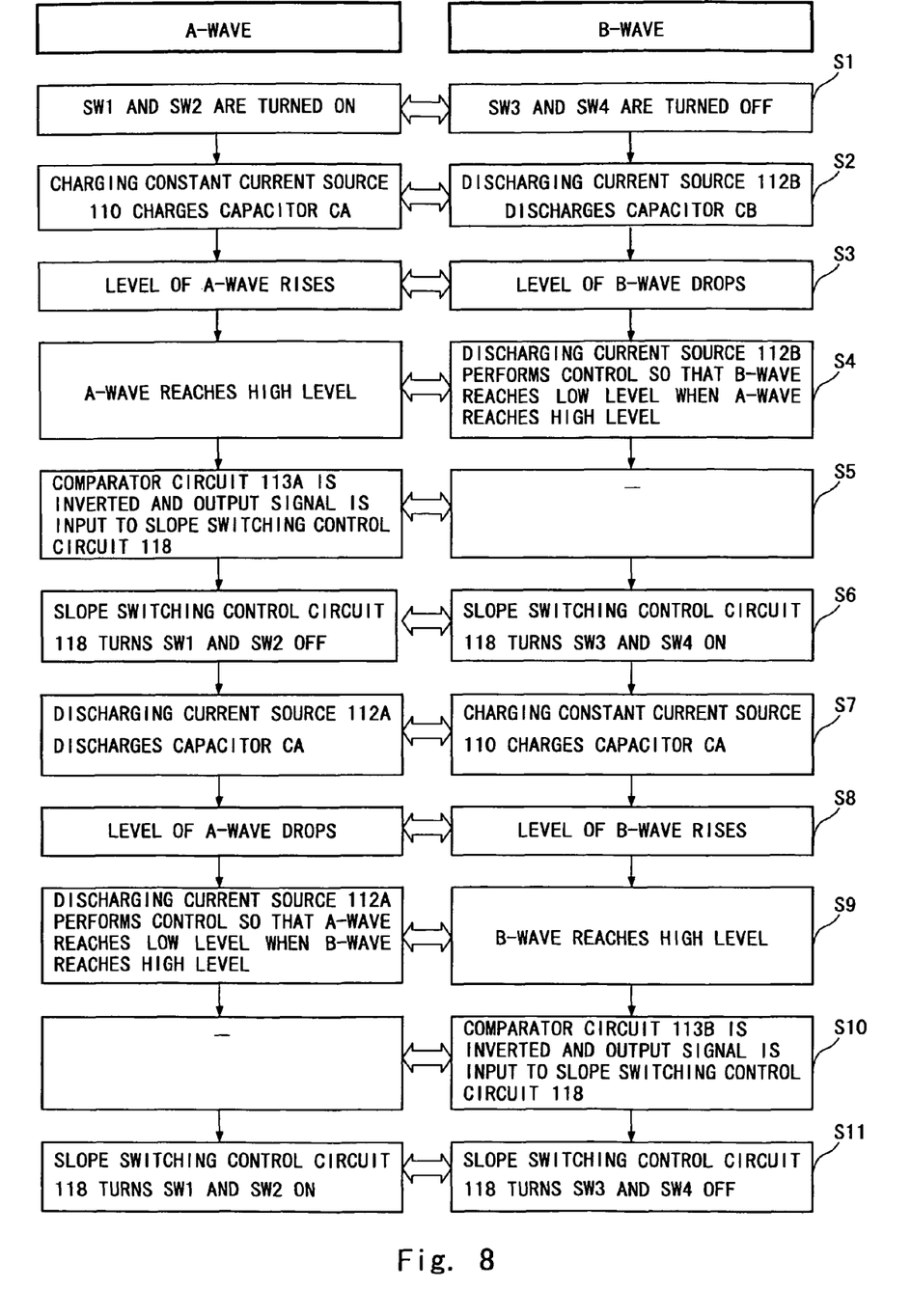
FIG. 8 is a flowchart showing a flow of processing performed in the triangular wave generator shown in FIG. 1.

Next, referring to FIG. 8, a flow of processing performed in the triangular wave generator 100 is described.

As shown in FIG. 8, when the switch SW1 and the switch SW2 are turned on and the switch SW3 and the switch SW4 are turned off (S1), the charging constant current source 110 charges the capacitor CA and the discharging current source 112B discharges the capacitor CB (S2). As a result, the level of the A-wave rises, to thereby obtain the up-slope waveform, and the level of the B-wave drops, to thereby obtain the down-slope waveform (S3).

The voltages of the A-wave and the B-wave are input to the comparator circuit 113A and the comparator circuit 113B of the output voltage monitoring circuit 106, respectively, and are each compared with the high level Vh. Also, the voltages of the A-wave and the B-wave are input to the level detection circuit 114A and the level detection circuit 114B, respectively. The oscillation levels of the A-wave and the B-wave, which are detected by the level detection circuit 114A and the level detection circuit 114B, are compared with the oscillation level reference potential Vm by the current control circuit 115A and the current control circuit 115B, respectively.

When the state of Step S3 is maintained and the A-wave reaches the high level Vh, according to the results of the comparison between the oscillation level of the B-wave and the oscillation level reference potential Vm, the current control circuit 115B adjusts the current supplied by the discharging current source 112B of the second triangular wave oscillation circuit 102B so that the B-wave becomes the low level (S4).

Simultaneously, the signal indicating that the A-wave reaches the high level is input from the comparator circuit 113A to the slope switching control circuit 118 (S5).

Upon reception of the signal from the comparator circuit 113A, the slope switching control circuit 118 outputs the control signal to turn the switches SW1 and SW2 off and to turn the switches SW3 and SW4 on (S6).

In accordance with switching operations by the switches, the discharging current source 112A discharges the capacitor CA and the charging constant current source 110 charges the capacitor CB (S7). As a result, the level of the A-wave drops, to thereby obtain the down-slope waveform, and the level of the B-wave rises, to thereby obtain the up-slope waveform (S8).

When the state of Step S8 is maintained and the B-wave reaches the high level Vh, according to the results of the comparison between the oscillation level of the A-wave and the oscillation level reference potential Vm, the current control circuit 115A adjusts the current supplied by the discharging current source 112A of the first triangular wave oscillation circuit 102A so that the A-wave becomes the low level (S9).

Simultaneously, the signal indicating that the B-wave reaches the high level is input from the comparator circuit 113B to the slope switching control circuit 118 (S10).

Upon reception of the signal from the comparator circuit 113B, the slope switching control circuit 118 outputs the control signal to turn the switches SW1 and SW2 on and to turn the switches SW3 and SW4 off (S11).

Figure 9:
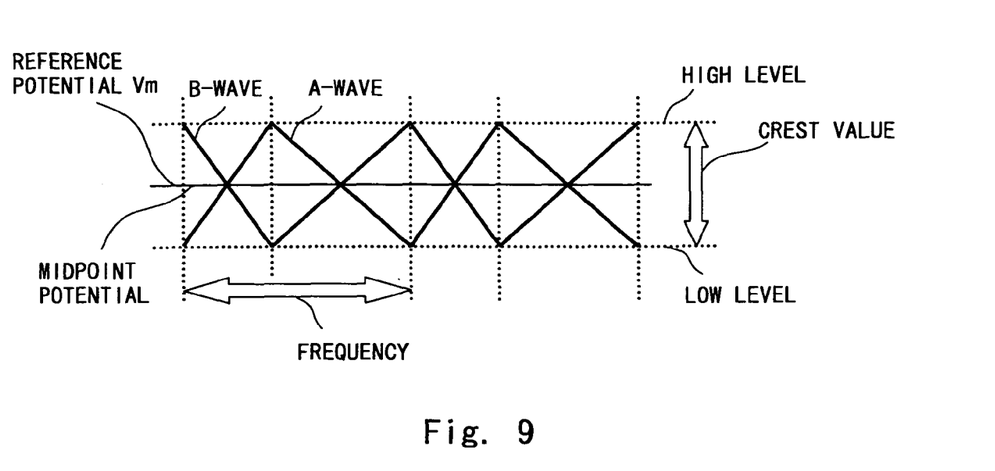
FIG. 9 is a diagram showing two phased triangular waves generated by the triangular wave generator shown in FIG. 1.

In this manner, the processing starting from Step S is repeated, with the result that two phased triangular waves shown in FIG. 9 are generated.

As shown in FIG. 9, the A-wave and the B-wave that are generated by the triangular wave generator 100 have the same frequency and the same crest value, with phases opposite to each other. The midpoint potential between the A-wave and the B-wave is constantly maintained at the oscillation level reference potential Vm.

In the triangular wave generator 100 of the first embodiment, the discharging current sources 112A and 112B are separately provided to the first triangular wave oscillation circuit 102A and the second triangular wave oscillation circuit 102B that generate the triangular waves with phases opposite to each other, whereby the oscillation levels of the A-wave and the B-wave can be separately controlled. As a result, if the capacitor CA of the first triangular wave oscillation circuit 102A and the capacitor CB of the second triangular wave oscillation circuit 102B vary in capacitance, the voltage of the B-wave can be adjusted to be set to the reference lower limit crest value when the A-wave reaches the high level, and the voltage of the A-wave can be adjusted to be set to the reference lower limit crest value when the B-wave reaches the high level. As a result, the crest values of the A-wave and the B-wave can be maintained at the same value with reliability.

Second Embodiment

Figure 10:
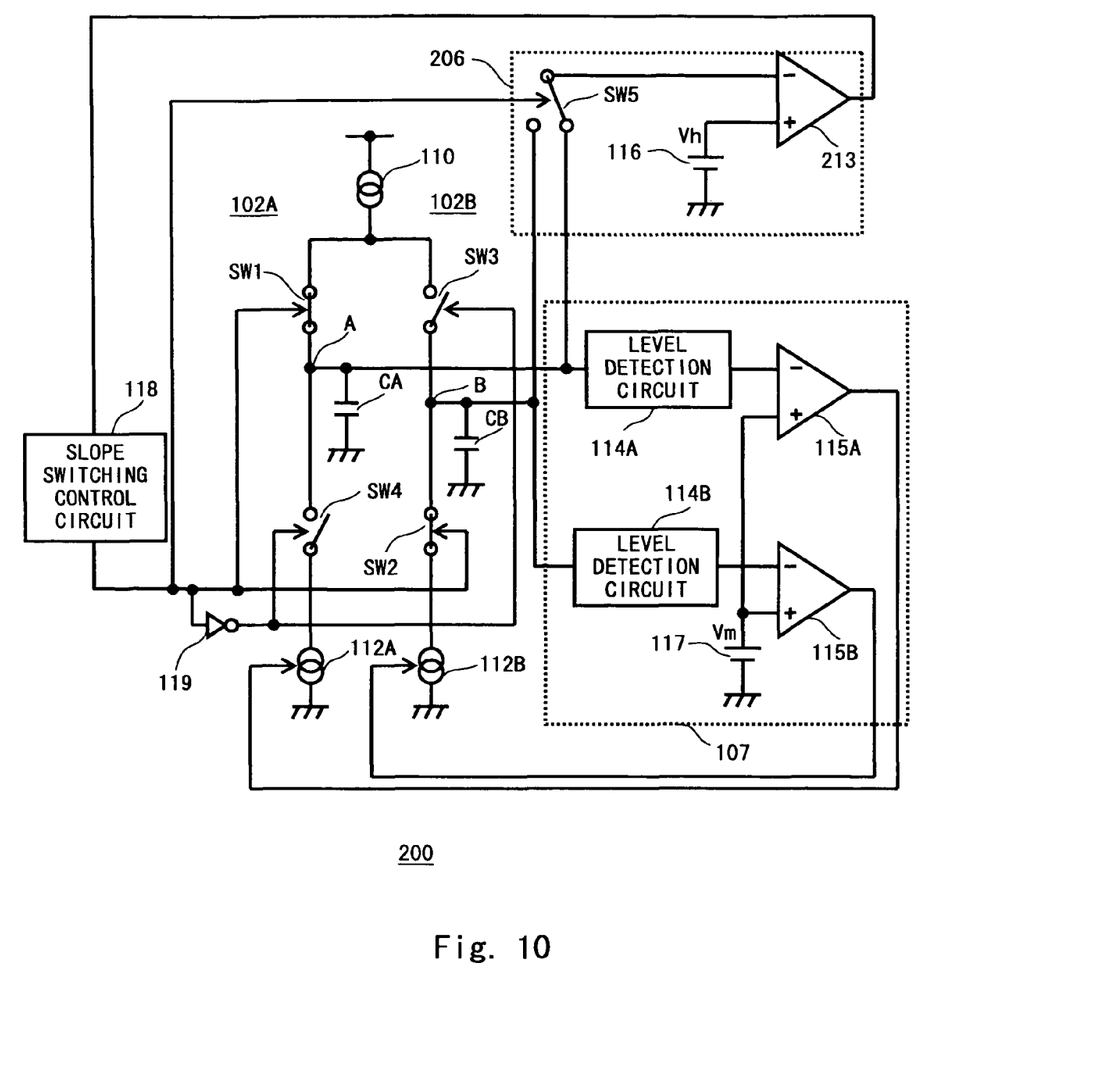
FIG. 10 is a diagram showing a triangular wave generator according to a second embodiment of the present invention.

FIG. 10 shows a triangular wave generator 200 according to a second embodiment of the present invention. Components of the triangular wave generator 200 are similar to the corresponding components of the triangular wave generator 100 except that an output voltage monitoring circuit 206 of the triangular wave generator 200 is different from the output voltage monitoring circuit 106 of the triangular wave generator 100. In FIG. 10, the components having the configuration similar to those of the triangular wave generator 100 are denoted by the same reference symbols, and detailed description thereof is omitted.

As shown in FIG. 10, the output voltage monitoring circuit 206 includes a switch SW5, a reference voltage source 116 for supplying the reference upper limit crest value, that is, the high level Vh, and a comparator circuit 213. The switch SW5 inputs one of the A-wave and the B-wave, which has the up-slope waveform, to the comparator circuit 213. Specifically, when the switches SW1 and SW2 are turned on and the switches SW3 and SW4 are turned off, the A-wave is input to the comparator circuit 213. On the other hand, when the switches SW1 and SW2 are turned off and the switches SW3 and SW4 are turned on, the B-wave is input to the comparator circuit 213.

In the same manner as in the output voltage monitoring circuit 106 of the triangular wave generator 100, the output voltage monitoring circuit 206 monitors whether the voltage of one of the A-wave and the B-wave reaches the high level Vh. The triangular wave whose voltage is likely to reach the high level Vh corresponds to the triangular wave having the up-slope waveform. Accordingly, it is sufficient to monitor only the triangular wave having the up-slope waveform. The output voltage monitoring circuit 206 monitors the output voltage of the triangular wave having the up-slope waveform and switches monitoring targets between the A-wave and the B-wave in the above-mentioned manner, whereby the number of comparator circuits can be reduced by one. Note that the switching operation by the switch SW5 may be controlled by the slope switching control circuit 118.

With the triangular wave generator 200, the same effects as those of the triangular wave generator 100 shown in FIG. 1 can be obtained.

The present invention has been described above with reference to the embodiments. The embodiments are illustrative, and various alterations, additions, and omissions may be made without departing from the gist of the present invention. It is apparent to those skilled in the art that modified examples in which those alterations, additions, and omissions are made are also within the scope of the present invention.

For example, in the above embodiments, the circuit shown in FIG. 7 is used as a circuit for detecting an oscillation level of a triangular wave. However, any type of circuits, such as a lowpass filter, can be employed, as long as the circuit is capable of detecting the oscillation level of the triangular wave.

It is apparent that the present invention is not limited to the above embodiments, but may be modified and changed without departing from the scope and spirit of the invention.

What is claimed is:

1. A triangular wave generator, comprising:
    two triangular wave oscillation circuits generating triangular waves with phases opposite to each other; and
    a slope switching circuit monitoring an output voltage of each of the two triangular wave oscillation circuits, to switch an output voltage generation mode of one of the two triangular wave oscillation circuits, from an up-slope waveform mode to a down-slope waveform mode, when an output voltage of the one of the two triangular wave oscillation circuits reaches a reference upper limit crest value, and to switch an output voltage generation mode of other of the two triangular wave oscillation circuits, from the down-slope waveform mode to the up-slope waveform mode; and
    an oscillation level control circuit controlling an oscillation level of the other of the two triangular wave oscillation circuits so that the output voltage of the other of the two triangular wave oscillation circuits becomes a reference lower limit crest value during switching of the output voltage generation mode,
    wherein the two triangular wave oscillation circuits are capable of independently controlling oscillation levels of the triangular waves generated by the two triangular wave oscillation circuits.

2. The triangular wave generator according to claim 1, wherein the two triangular wave oscillation circuits each include:
    a capacitor connected between an output terminal of each of the two triangular wave oscillation circuits and a reference potential;
    a charging circuit charging the capacitor so as to generate an output voltage having an up-slope waveform; and
    a discharging circuit discharging the capacitor so as to generate an output voltage having a down-slope waveform.

3. The triangular wave generator according to claim 2, wherein:
    the oscillation level control circuit comprises an oscillation level detection circuit detecting the oscillation level of each of the two triangular wave oscillation circuits, the oscillation level being a mean value of an output voltage of each of the two triangular wave oscillation circuits; and
    the oscillation level control circuit controls the discharging circuit of the corresponding triangular wave oscillation circuit so that an output of the oscillation level detection circuit matches a value of an oscillation level reference potential.

4. The triangular wave generator according to claim 2, wherein the slope switching circuit switches an operation mode of the capacitor of each of the two triangular wave oscillation circuits, between a charging mode and a discharging mode, to thereby switch the output voltage generation mode of each of the two triangular wave oscillation circuits.

5. The triangular wave generator according to claim 4, wherein:
    the charging circuit comprises a constant current source;
    the discharging circuit comprises a variable current source provided for each of the capacitors; and
    the oscillation level control circuit controls a current of the variable current source of the other of the two triangular wave oscillation circuits, to thereby control the oscillation level of the other of the two triangular wave oscillation circuits.

6. The triangular wave generator according to claim 5, wherein:
    the constant current source is shared by the two triangular wave oscillation circuits; and
    the slope switching circuit causes the constant current source to be selectively connected to the capacitor of one of the two triangular wave oscillation circuits.

7. The triangular wave generator according to claim 5, wherein the variable current source comprises an NMOS transistor having a various bias.

8. The triangular wave generator according to claim 7, wherein:
    the constant current source is shared by the two triangular wave oscillation circuits; and
    the slope switching circuit causes the constant current source to be selectively connected to the capacitor of one of the two triangular wave oscillation circuits.

9. The triangular wave generator according to claim 1, wherein:
    the oscillation level control circuit comprises a level detection circuit detecting the oscillation level of each of the two triangular wave oscillation circuits; and
    the oscillation level control circuit controls the other of the two triangular wave oscillation circuits according to a difference between the oscillation level of the other of the two triangular wave oscillation circuits, the oscillation level being detected by the level detection circuit, and an oscillation level reference potential set according to the reference lower limit crest value.

10. The triangular wave generator according to claim 9, wherein the level detection circuit comprises:

two resistors connected in series between an input terminal of the level detection circuit and a reference potential;

an output terminal connected to a voltage dividing point between the two resistors; and a capacitor having one end connected between the output terminal and the voltage dividing point and having another end connected to the reference potential.

11. The triangular wave generator according to claim 9, wherein the level detection circuit comprises a lowpass filter.

* * * * *